United States Patent [19]

Nakagawa et al.

[11] 4,148,065
[45] Apr. 3, 1979

[54] METHOD AND APPARATUS FOR AUTOMATICALLY INSPECTING AND CORRECTING MASKS

[75] Inventors: Kiyoshi Nakagawa; Soichi Toorisawa, both of Tokyo; Hiroyuki Ibe; Shigeaki Nakashima, both of Kodaira; Yasuhiko Hara, Yokohama, all of Japan

[73] Assignee: Hitachi, Ltd., Japan

[21] Appl. No.: 762,270

[22] Filed: Jan. 25, 1977

[30] Foreign Application Priority Data

Dec. 8, 1976 [JP] Japan .................... 51-146512

[51] Int. Cl.² ............................................. H06N 7/18
[52] U.S. Cl. ................................. 358/101; 250/563; 250/572; 358/106; 358/107; 364/515
[58] Field of Search ................. 358/106, 107, 101; 364/515, 564; 356/156, 158, 165, 167, 168; 235/92 PD, 92 MT; 250/559, 562, 563, 572

[56] References Cited

U.S. PATENT DOCUMENTS

| 3,049,588 | 8/1962 | Barnett | 358/106 |
| 3,546,377 | 12/1970 | Troll | 358/106 |
| 3,795,452 | 3/1974 | Bourdelais | 358/106 |
| 3,887,762 | 6/1975 | Uno | 358/101 |
| 3,916,439 | 10/1975 | Lloyd | 358/106 |
| 3,978,324 | 8/1976 | Rayner | 364/515 |
| 4,056,716 | 11/1977 | Baxter | 358/106 |

Primary Examiner—Howard W. Britton
Attorney, Agent, or Firm—Craig & Antonelli

[57] ABSTRACT

A pair of chromium masks of similar pattern are optically read out to generate video signals corresponding to the patterns thereon. Comparison of the pair of masks is carried out in binary signals converted from the video signals using different recognition thresholds, thereby discriminating defects in the masks. Defect information is recorded in a recording medium and used for identifying and positioning the defects in the correction process.

12 Claims, 31 Drawing Figures

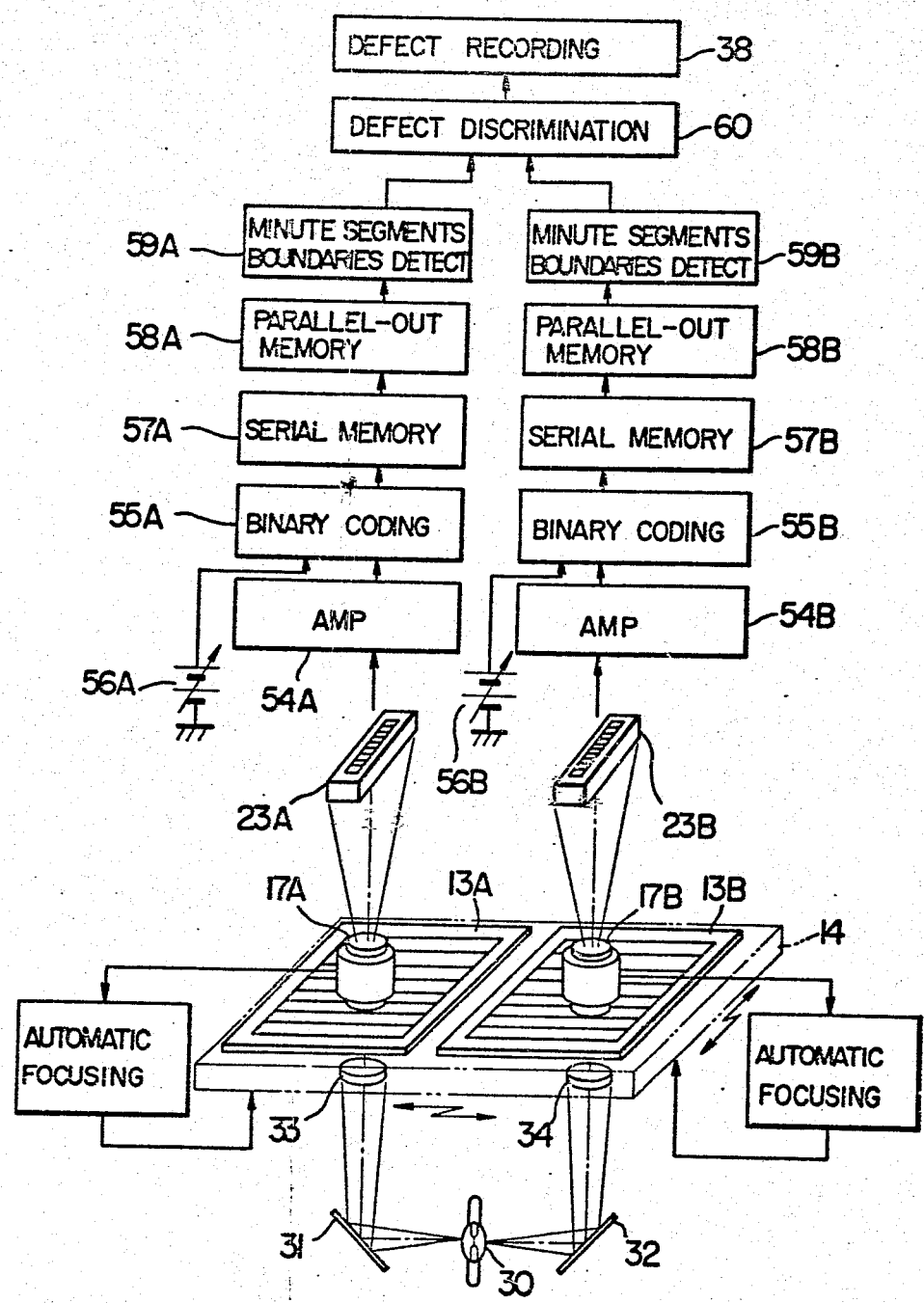

METHOD AND APPARATUS FOR AUTOMATICALLY INSPECTING AND CORRECTING MASKS

This invention relates to method and apparatus for automatically inspecting and correcting photomasks used in the semiconductor industries.

In the manufacture of semiconductor devices and integrated circuit (IC) devices, there exist steps of forming an oxide film pattern of desired shape on a thin semiconductor wafer and diffusing impurity atoms into the regions not covered with the oxide pattern or of forming a desired wiring pattern of aluminium, etc. Such an oxide or aluminium pattern is formed in the following way. First, an oxide or aluminium film is deposited on the whole surface of a semiconductor wafer and then a photoresist film is coated thereon. A photomask is disposed on the photoresist in close contact thereto or with a predetermined gap therefrom. Ultraviolet lights are irradiated on the photoresist film through the photomask to sensitize the photoresist film. The sensitized or non-sensitized regions of the photoresist film are removed by etching to leave a photoresist pattern. The oxide or aluminium film on the wafer surface is subjected to an etching treatment using the remaining photoresist pattern as a mask, thereby forming an oxide or aluminium pattern.

The quality of such oxide pattern or aluminium wiring pattern dominates the yield and the reliability of the semiconductor devices. Therefore, such patterns should be formed with high accuracy.

The quality of the oxide or aluminium pattern is largely determined by the quality of the photomask. Therefore, the pattern in the photomask is desired to be formed very precisely prior to the manufacture of the semiconductor device. These arises a need for inspecting the pattern of the manufactured mask and correcting defective portions if any.

Conventionally, chromium patterns deposited on glass plates have been used as correctable masks. Defective portions in the chromium mask are generally inspected by the following methods:

(1) Eye-measurement method or visual inspection of inspecting defective portions in a mask by eye measurement using a mask analyzer;

(2) Method of comparing two chip patterns in a mask through photoelectrically converted signal and discriminating defective portions by the difference in the photoelectrically converted signals (see the article by Bruning, Sitting: entitled "An Automated Mask Inspection System"; IEE Vol. ED22, No. 7, p.p. 487 to 495, July 1975)

(3) Method of Fourier-transforming the mask pattern and subtracting irregular defective portions by filtering (see the article by L. S. Watkins: entitled "Application of Spatial Filtering Subtraction to Thin Film and IC Mask Inspection"; Appl. Opt. Vol. 12, p. 1880, 1973).

These methods are accompanied with respective drawbacks; method (1) has drawbacks that some defective portions may be over-looked and that the time required for inspection is long, method (2) has drawbacks that minute defectives smaller than 2 μm cannot be detected and there is some danger of mis-discriminating normal portions as defective portions, and method (3) has a drawback that there is no direct correspondence between the defect detection and the positional identification. More particularly, according to method (2) the video signals for the two chip patterns cannot be perfectly synchronized but there exists some time lag due to the positional displacement of the two normal chip patterns within the tolerance which may differ one from another. Thus, defective portions smaller than the maximum tolerance cannot be detected. If the detection threshold is lowered to raise the detection accuracy, some normal portions may be discriminated as defective ones. On the other hand according to method (3), the information of the normal pattern is erased in the filtering process. Therefore, there remains no correspondence between the mask pattern and the detected defective portions. Only the existence of some defective portions in a mask pattern can be detected and there is a gap for correcting the detected defective portions in the mask pattern. Thus, the total operation efficiency is very low.

This invention is intended to solve the above drawbacks of the conventional techniques. An object of this invention is to provide a method of inspecting and correcting defective portions in a mask pattern with high accuracy and high operation efficiency.

Another object of this invention is to provide an apparatus for inspecting and correcting defective portions in a mask pattern with high accuracy and high operation efficiency.

According to one aspect of this invention, there is provided a method of inspecting and correcting defective portions of a photomask formed of a predetermined pattern of an opaque film deposited on a principal surface of a transparent substrate comprising the steps of preparing a pair of masks, converting the pattern images of these masks into electric signals, further converting the electric signals into binary signals on the basis of a reference value, comparing these binary signals subjected to predetermined logic operations and discriminating a defective portion in the pattern by a signal appearing only in one mask pattern signal.

According to another object of this invention, there is provided an apparatus for inspecting and correcting defective portions of a photomask formed of a predetermined pattern of an opaque film deposited on a principal surface of a transparent substrate according to the above-described method.

The information of the detected defective portions, i.e. the identification information of a defective mask and the position (xy-coordinates) of a defective portion in the mask, may be stored in a memory means such as a magnetic tape, a disk or a core memory and then read out from the memory in the process of correcting the defective portions of the mask.

Further objects, features and advantages of this invention will become apparent from the following description of the preferred embodiments when taken in conjunction with the accompanying drawings.

FIGS. 3a and 3b are illustrative views for explaining the inspection of a pair of masks in which; FIG. 3a is a top plan view of a pair of masks with illustration of scanning traces and FIG. 3b is a partial perspective view of an area control means for defining the scanning area.

FIG. 4 is an illustrative drawing showing how the patterns of a pair of masks are converted into electric signals and electrically processed to inspect any defective portions.

FIG. 5a is a block diagram showing an example of binary-coding a video signal utilizing three threshold values; FIG. 5b is a circuit diagram showing the details of FIG. 5a; and FIG. 5c is a flow chart of the logic circuit in FIG. 5a.

FIG. 6 is a schematic diagram showing the relation of a photodiode array and a pattern under reading.

FIGS. 15a to 15c, and 16a to 16c are schematic diagrams of bit structures for detecting boundaries.

Figure 1:
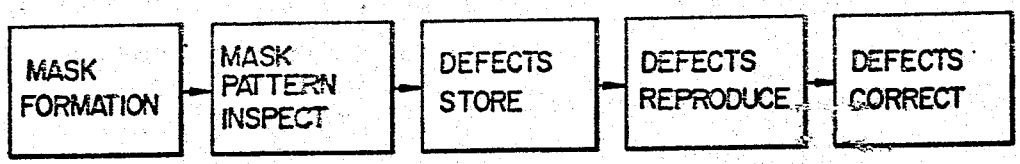
FIG. 1 is a flow chart illustrating the outline of the automatic mask inspection and correction according to this invention.

FIG. 1 is a flow chart of the method of automatically inspecting and correcting masks according to this invention. As shown in the figure, a pair of manufactured masks are subjected to pattern inspection to detect defective portions. The detected defective portions are recorded in a recording medium such as a magnetic cassette tape using a recording device. Then, the data of the defective portions recorded in the cassette tape are read out and used for identifying the defective portions in a pattern correcting device.

Figure 2:
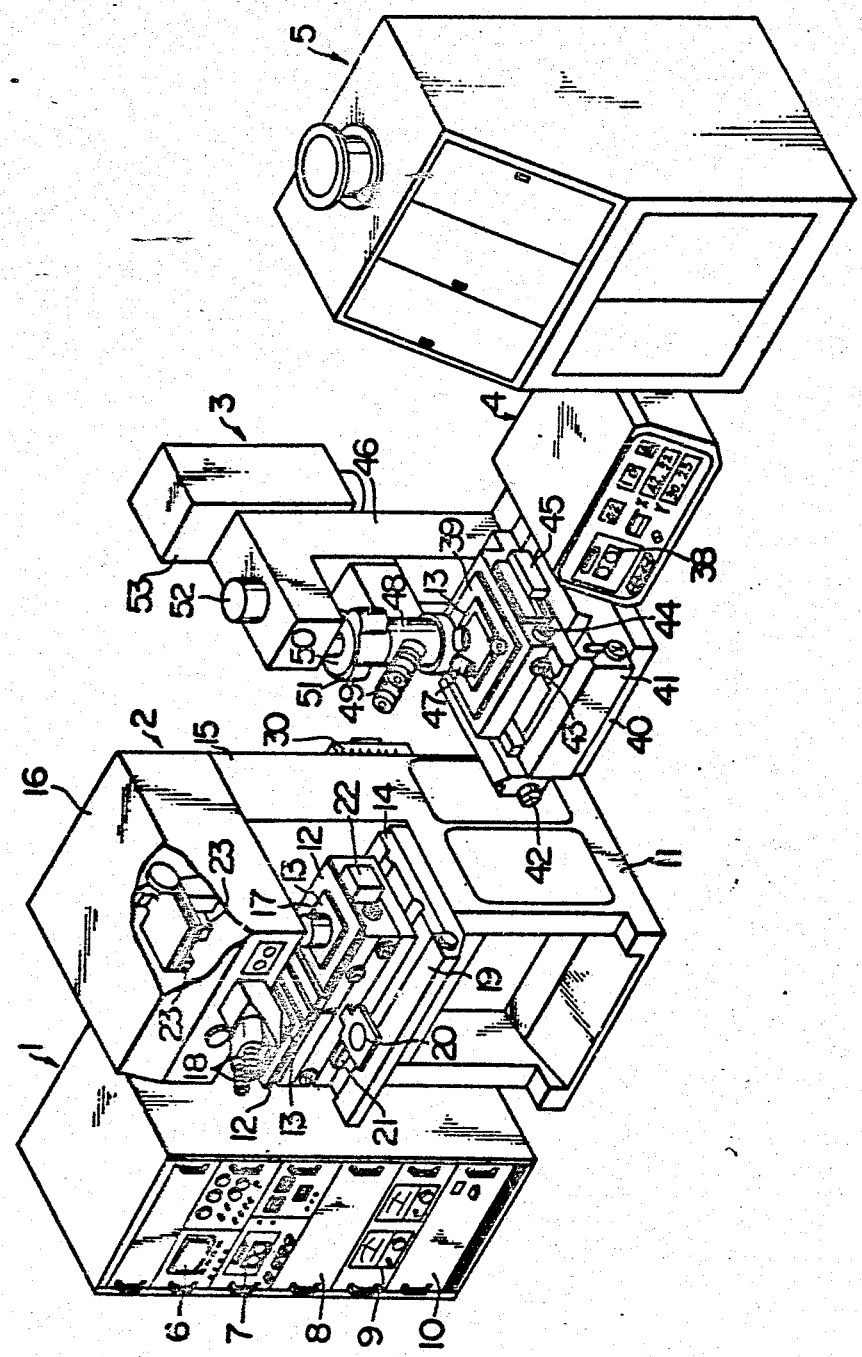
FIG. 2 is a perspective view showing a group of units to be used in the automatic mask inspection and correction according to an embodiment of this invention.

FIG. 2 shows a group of processing devices, in which are shown from the lefthand side to the righthand side a control unit 1 including a memory device, a mask inspection unit 2, a light exposure device 3 which forms part of the pattern correcting unit, a read-out control device 4 for reading out the information of a defective portion and an etching device 5 which constitute part of the pattern correcting unit. The control unit 1 contains from the upper side to the lower side a synchroscope 6 for monitoring the video signal of the mask pattern, a mount 7 for loading a cassette tape, a detection circuit 8 for electrically detecting the patterns of a pair of masks and discriminating the existence of a defective portion, an automatic focusing circuit 9 for driving a mask and focusing the objective lens on the mask and a power source circuit 10. The mask inspection unit 2 includes a support carrier 11, an xy scanning stage 14 mounted on the carrier 11 and mounting a pair of masks 13 in juxtaposition to each other on mask holders 12, a column 15 extending upwardly from one side portion of the carrier 11 and a support box 16 fixed on the column 15, and an optical system comprising a pair of objective lens systems 17 and a pair of eye lens systems 18. The xy-scanning stage 14 is movable in the longitudinal and the transverse directions on a horizontal plane, i.e. x- and y-directions, and also in the vertical direction, i.e. z-direction. The stage 14 is translated by a scanning motor 19. The movement of the xy-scanning stage 14 is controlled by an inspection area control means 20. A linear encoder 21 and an automatic focusing motor 22 are also provided on the xy-scanning stage 14. An image pick-up means including a pair of arrays 23 of photodiodes is disposed in the support box 16.

Figure 3A:
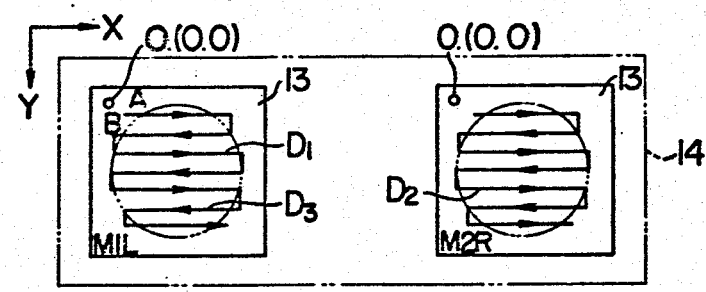
Figure 3B:
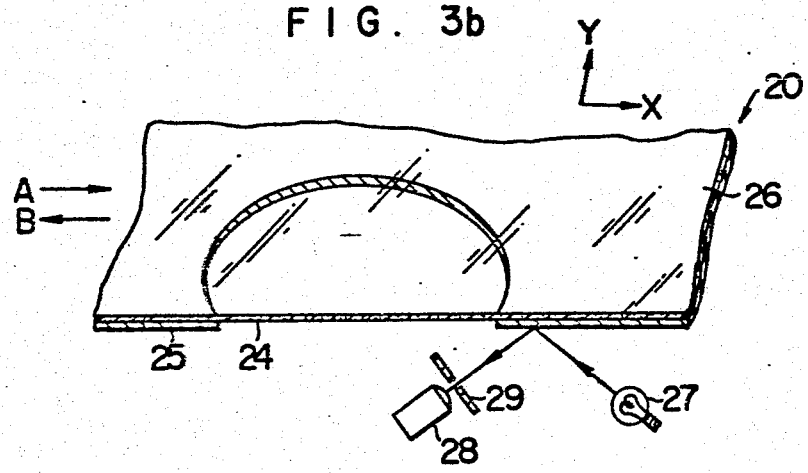

Processes or procedures for inspecting the patterns of a pair of masks will be described next. First, a pair of masks 13 to be inspected are prepared and set on the xy-scanning stage 14. Then, the automatic focusing motor 22 is controlled to bring the distance from the mask to the objective lens at a predetermined value to achieve focusing. This process is for the purpose of projecting the image of the mask pattern on the photodiode array in the correctly focused state. Then, as shown in FIG. 3a, the xy-scanning stage 14 is moved in zig-zag form as shown by arrows for picking up the total images of the respective mask patterns by the photodiode arrays 23. Here, since the semiconductor wafers are usually in circular shapes, the utilization area in the mask pattern formed on the mask 13 is usually circular as shown by the dotted broken line in FIG. 3a corresponding to the wafer shape. Therefore, for reducing the inspection period, the image pick-up process by the photodiode array may be achieved only on the utilization area of the mask pattern 13, i.e. in the circular area. To facilitate such function, the inspection area control means 20 is provided on the xy-scanning stage 14. FIG. 3b shows the outline of the manner of controlling the scanning of the xy-scanning stage utilizing the scanning area control means 20. This scanning area control means 20 comprises a templet 26 formed by depositing a chromium layer 25 on the lower surface of a transparent glass plate 24 except a circular region, a light source 27 for projecting lights on the surface of the templet deposited with the chromium layer 25 and a light detector 28 provided with a slit 29 for receiving the lights emitted from the light source 27 and reflected by the chromium layer 25. The templet 26 is attached on the xy-scanning stage 14 in such a manner that the position on the templet 26 irradiated by the light source 27 and reflecting lights to the detector 28 corresponds to the position in the mask 13 the image of which is picked up by the photodiode array. The light source 27 and the light detector 28 are fixedly mounted on the carrier 11 with a predetermined distance separated from each other to be disposed beneath the templet 26. The slit 29 is so adjusted that the detector 28 receives only lights emitted from the light source 27 and reflected by the templet 26 with sufficient accuracy. When, the x-scanning stage is translated in the direction indicated by arrow A shown in FIG. 3b, lights are emitted from the source 27 onto the templet. Neglecting the reflectance of glass in comparison with that of chromium, the light detector 28 receives no light and the scanning of the x-stage proceeds while the circular portion of the templet 26 is scanned. Along with the scanning, the light reflected by the chromium layer 25 becomes to enter the slit 29. Then, the detector 28 generates a detection signal and the scanning is stopped. Then, the y-stage is translated or moved by one field of view of the photodiode array. Then, the x-stage is translated in the opposite direction to the previous one, i.e. in the direction indicated by arrow B shown in FIG. 3b. Similar steps are repeated to scan the whole area in the circle. Thus, defective portions in the circular areas of the photomasks are inspected by moving the xy-scanning stage and picking up the images of patterns of the photomasks in the circular area by the photodiode arrays.

Then, the conversion of the mask pattern into an electric signal and detection of defective portions from the electric signal will be described.

Figures 5A, 6:
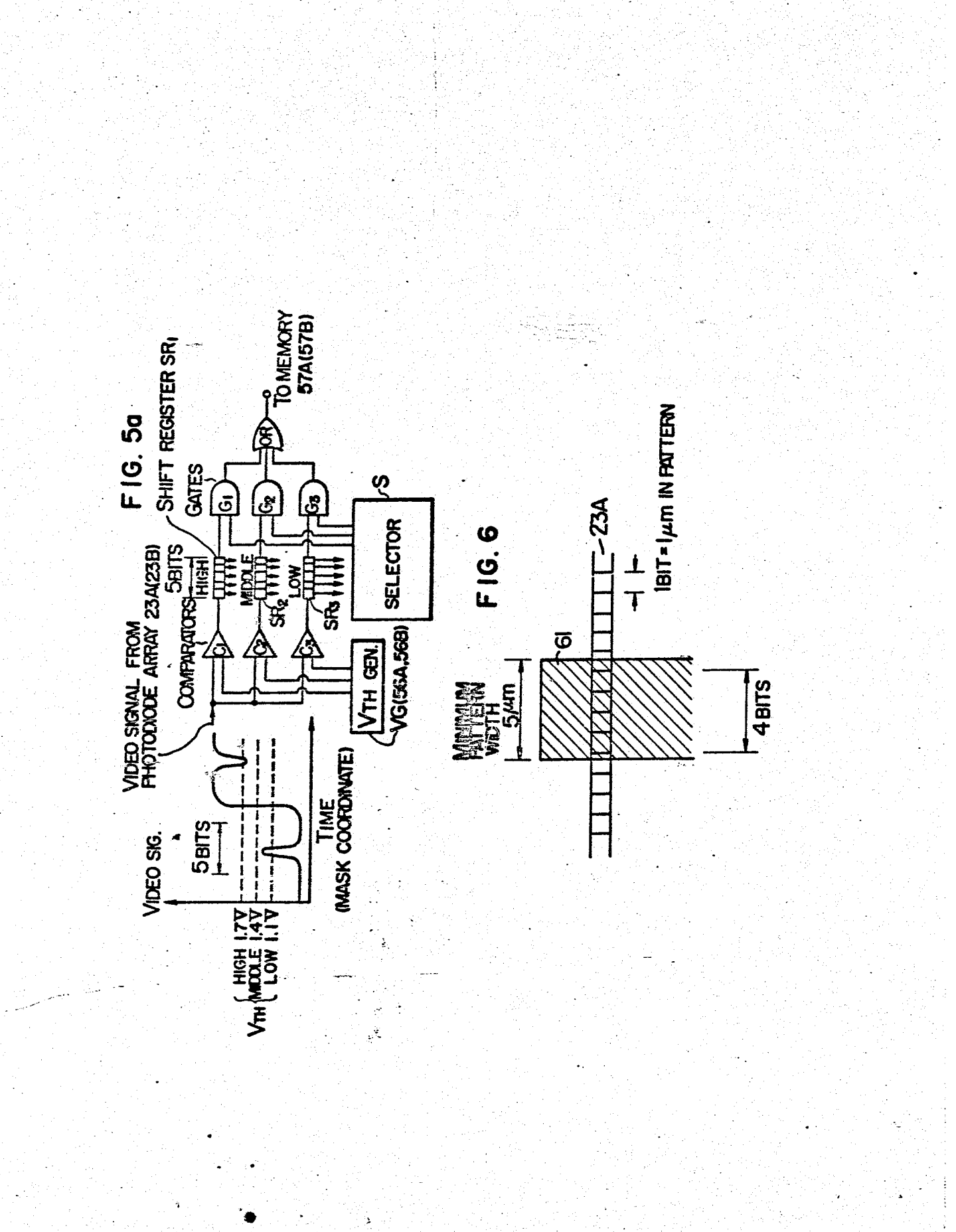
Figure 5B:
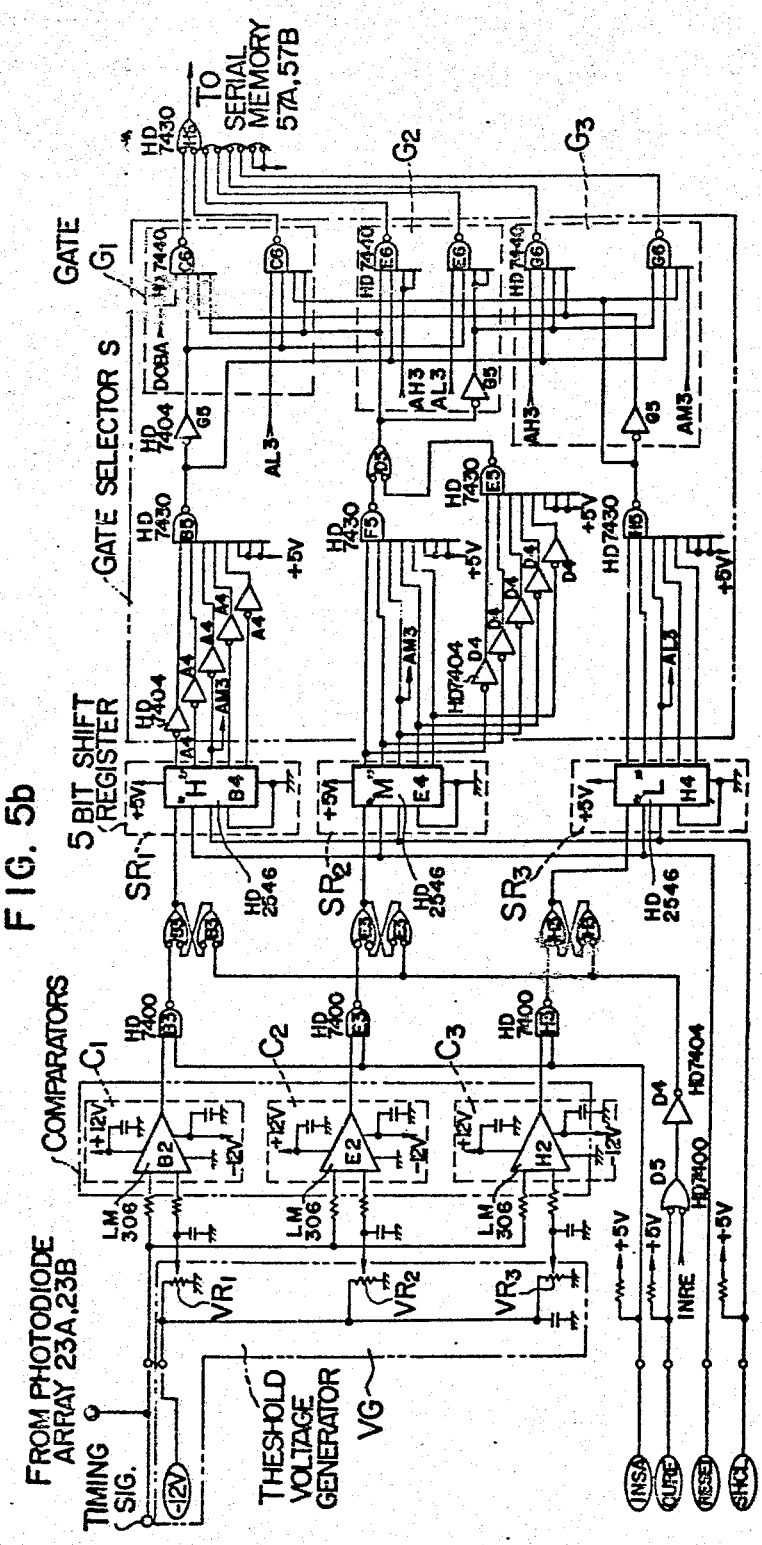
Figure 5C:
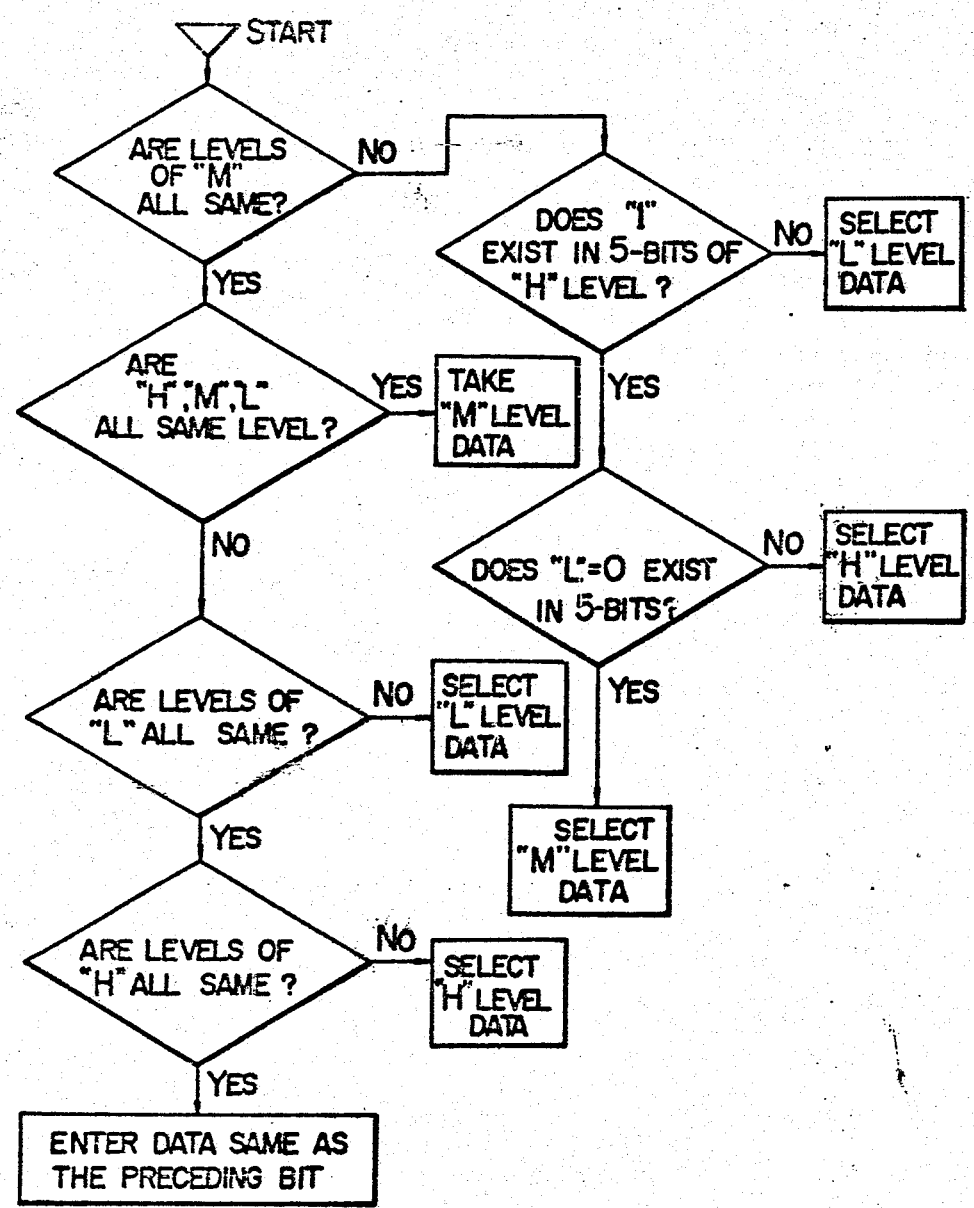

FIG. 4 shows how the defective portions are inspected. In the figure, a light source 30 of high brightness or luminance may be a 250 W mercury lamp. The lights from the light source 30 are reflected by mirrors 31 and 32, condensed by condenser lenses 33 and 34 and projected on the masks 13A and 13B. The lights transmitted through the masks 13A and 13B and carrying the pattern information are directed on the photodiode arrays 23A and 23B through the objective lenses 17A and 17B. Each of the photodiode arrays 23A and 23B is formed of a linear alignment of 256 photodiodes each having a dimension of 25.4 μm square. Here, for obtaining a resolution of 1 μm square, an expanded image, 25 times as large as the mask pattern, is focused on the photodiode array. Photodiodes of the arrays 23A and 23B are aligned in y-direction of the xy-scanning stage. The xy-stage carrying the photomasks is driven in x-direction in the zig-zag manner as described above to provide the information of two-dimensional pattern. Lights arrived at the photodiode array are converted into video signals, each having a voltage corresponding to the intensity of the light transmitted through the mask pattern in the unit area of 1 μm square. The photodiode arrays are activated by clock (timing) pulses. Each video signal corresponds to the area of 1 μm square in the mask pattern. The video signals are amplified by amplifiers 54A and 54B and the amplified signals are supplied to comparators 55A and 55B. The comparators compare the input signals with a group of constant threshold values and quantize the input signals into binary signals, for example ones having the levels of 5 V and 0 V corresponding respectively to the white and black of the pattern i.e. absence and existence of the chromium mask in the detected area. Voltage sources 56A and 56B supply the threshold voltages to the comparators for binary-coding 55A and 55B. As the pattern becomes finer, namely, as minute portions such as excess chromium portions and pinholes in the chromium layer of the mask pattern are photoelectrically detected, a definite video signal becomes unintelligible and the binary coding of the pattern on the basis of one threshold value becomes difficult. Therefore, three threshold values, namely, high, middle and low threshold voltages of 1.7 V, 1.4 V and 1.1 V respectively are provided in this embodiment and the video outputs using these three threshold values are logically processed to select a gate for generating the binary signal, in the manner as shown in FIGS. 5a to 5c. The selection of the gate, i.e., a binary coded signal is determined from the history of succeeding five bits including preceding two bits, the bit under inspection and the following two bits on a time base.

In FIG. 5a, each of the above-mentioned comparators for binary-coding 55A and 55B comprises a threshold generator VG, as simply indicated by 56A or 56B, for providing three constant potentials of 1.1 V, 1.4 V and 1.7 V, which provide thresholds of a dark level, a normal level and a bright level for the detected video signal respectively. The binary coding device comprises threshold comparators $C_1$, $C_2$ and $C_3$ connected in each input to the different outputs of the threshold generator VG, respectively. The threshold comparators are formed of usual operational amplifiers, which may be of the type LM306 manufactured by National Semiconductor Corp. As the other comparison input, a video signal is applied to each threshold comparator through video amplifier 54A and 54B from the photodiode array 23A or 23B. From threshold comparators $C_1$, $C_2$ and $C_3$ threshold-dependent bit signals "1" and "0" are developed for the high "H", middle "M", and low "L" thresholds and supplied to five-bit shift registers $SR_1$, $SR_2$ and $SR_3$, respectively. The five-bit shift register may be of the type HD2546, manufactured by Hitachi Limited. A gate selector S includes a logic circuit which comprises NAND gates of the types HD7430, HD7440 and inverters of the type HD7404 which are trade name of IC function units by Hitachi. The logic circuit of the gate selector are connected to receive parallel-out bit signals from the shift registers $SR_1$, $SR_2$ and $SR_3$ and performs a predetermined logic operation to determine the selection of a gate to be operated with respect to the threshold-dependent bit signals at the third bit positions, i.e., the central digit position of the shift registers $SR_1$, $SR_2$ and $SR_3$. The logic circuit of the gate selector S is constructed to operate in the manner shown by the flow chart in FIG. 5c. In the flow chart, the symbols "M", "H" and "L" respectively denote middle, high and low threshold-dependent bit signals which are supplied from the corresponding shift registers in five-bit parallel-out form. AND gates $G_1$, $G_2$ and $G_3$ are provided to be actuated by a selection signal from the gate selector S which is provided as a result of the logic operations as described in the flow chart. The AND gates $G_1$, $G_2$ and $G_3$ are applied with outputs at the third bit positions of the shift registers $SR_1$, $SR_2$ and $SR_3$, either one of which is selected by the gate selection signal to pass a corresponding one of the "M", "H" and "L" threshold-dependent bit signals through an OR gate as a binary coded signal at an output terminal of the binary coding circuit 55A (or 55B). Then the binary coded signal thus converted from the input video signal is applied to the serial memory 57A (or 57B).

The details of the binary coding circuit of FIG. 5a are shown in FIG. 5b by way of example, in which the threshold voltage ($V_{th}$) generator comprises potentiometers $VR_1$, $VR_2$ and $VR_3$ for "H", "M" and "L" thresholds. The gate selector S indicated in the block achieves a logic shown in the flow chart of FIG. 5c. Parallel bit outputs of the shift register $SR_1$ respectively connected through respective inverters $A_4$ to NAND $B_5$, the output of which is supplied to a first NAND $E_6$ and a first NAND $G_6$, and to two NANDs $C_6$ and a second NAND $E_6$ through a first inverter $G_5$. Parallel five-bit outputs of shift registers $SR_2$ are applied to NAND gate $F_5$ and through inverters $D_4$ to NAND gate $E_5$. The outputs of NAND gates $F_5$ and $E_5$ are applied to NAND $D_5$, the output of which is applied to first NAND $E_6$ and through a second inverter $G_5$ to second NAND $E_6$ of the gate 2. Parallel five-bit outputs of the shift register $SR_3$ are applied to NAND $H_5$, the output of which is supplied to one NAND $G_6$ of gate $G_3$ and one NAND $C_6$ of gate $G_1$ through a third inverter $G_5$ and directly to the other NAND $G_6$ and the other NAND $C_6$ of gate $G_1$. The third bit signal $AH_3$ of $SR_1$ is supplied to the first NAND $G_6$ and the first NAND $E_6$, the third bit signal $AM_3$ of $SR_2$ to the second NAND $G_6$, and the third bit signal $AL_3$ of $SR_3$ to the second NAND $C_6$ and the second NAND $E_6$. In the gates $G_1$, $G_2$ and $G_3$, outputs of pairs of NANDs $C_6$, $E_6$ and $G_6$ respectively are applied to corresponding NANDs $M_6$ as OR gate of FIG. 5a, the output of which develops a binary coded signal to be supplied to the memory 57A (or 57B).

The binary coded signals are then recorded in serial memories 57A and 57B, each consisting of shift registers of 256 × 15 bits and then in parallel-out memories 58A and 58B, each consisting of shift registers of 15 × 15 bits.

Figure 12:
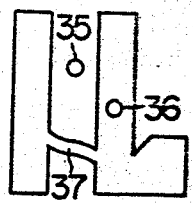
FIG. 12 is an illustrative diagrams for explaining the minute pattern comparison method and the boundary comparison method.

Here, the algorism of discriminating a defective portion will be briefly described referring to FIG. 12. First, the minute pattern comparison method and the boundary comparison method are employed in the present invention for discriminating a defective portion. Suppose that the correct pattern is one shown in the middle column of the upper row and the pattern shown in the left column of the upper row is a defective pattern including three defective portions 35, 36 and 37. According to the minute pattern comparison method, patterns are divided into small segments, each having a width smaller than the minimum pattern width of a designed pattern and detection signal is obtained for each segment to provide reproduced patterns as shown in the left and the middle columns of the middle row. The detection results of such minutely divided segments are compared to erase the common portions and leave minute portions existing only in either one pattern. Such minute portions are detected as shown by the pattern in the middle row of the right column.

According to the boundary comparison method, the boundary of black to white of a pattern, i.e. outline, is detected. Taking out boundaries existing only in either one pattern, a defect pattern as shown in the lower row of the right column is obtained.

Figure 13:
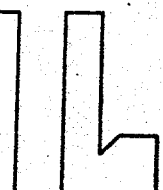
FIG. 13 is a schematic diagram showing the memory content in a magnetic tape.

Then, (xy) coordinates of each defective portion and the identification information of the defective mask discriminated by such defect discriminating algorism are stored in a cassette tape 38 shown in FIG. 2. The memory content of the cassette tape is as shown in FIG. 13, i.e. in the order of kind of mask, defect number (D1, D2, D3), identification of the defective mask (M1L, M2R) and the coordinates (x,y) of the defect in the mask.

Here, the algorism for discriminating or recognizing a defect will be described more in detail.

Referring to FIG. 4, the signals stored in the parallel-out memories 58A and 58B are read into the logic circuits 59A and 59B of the next stage and the presence and absence of any minute portions and boundaries is detected. Here, the term "minute portion" refers to a pattern smaller than the minimum pattern width in the designed mask pattern as described above. In the normal mask patterns, however, there are portions having smaller widthes than the minimum pattern width in some characters or letters and bonding pads. Therefore, a mask is discriminated defective when a minute portion is detected only in that mask but not in the other mask.

According to this method, however, although defects having smaller dimensions than the normal patterns can be detected, there still exists a danger of over-looking large defects. Therefore, the boundaries or the outlines of the pattern are detected. If there exist any boundaries only in one mask, one of the pair of masks is discriminated to be defective.

The defective portions of the mask pattern can only be perfectly detected by adopting two kinds of algorithms, e.g. the minute pattern comparison method and the boundary comparison method, as described above.

First, description will be made of the minute pattern comparison method. Referring to FIG. 6, the arrangement of the read-out bits of the parallel-out memories 58A and 58B corresponding to the masks 13A and 13B will be described. When a mask pattern 61 of the minimum pattern width of 5 μm is picked up in the photodiode array 23A, the mask pattern 61 allows to generate the converted signals only for 4 μm (in the least case) through the photodiodes. When the converted signal is binary-coded, this corresponds to four bits. Therefore, any pattern of three or less bits has a large possibility of being defective. Thus, the bit structure read out from the parallel-out memories 58A and 58B should be five bits; central three bits and each end one bit.

Figure 7A:
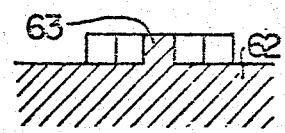
FIGS. 7a to 7c are schematic diagrams showing bit structures used for detecting minute portions.
Figure 7B:
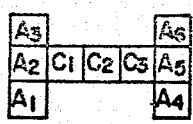
Figure 7C:
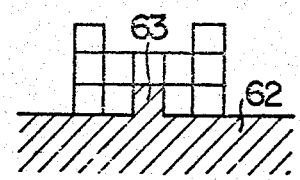

Further, in the case of reading only such five bits disposed on a line, when there exists a protruding or denting portion 63 in the edge portion of a normal pattern 62 due to the quantization error as in FIG. 7a, there is a danger that this edge portion 63 may be detected to be defective. To avoid such faulty detection, the bits disposed on the both sides of the end bits are read out simultaneously as shown in FIG. 7b. Then, there exist no danger of detecting this edge portion 63 as defective, as seen from FIG. 7c. The criteria for discriminating a defective portion are as follows:

all the bits $A_1$, $A_2$, $A_3$, $A_4$, $A_5$ and $A_6$ are "0" and at least one of the bits $C_1$, $C_2$ and $C_3$ is "1"; or all the bits $A_1$, $A_2$, $A_3$, $A_4$, $A_5$ and $A_6$ are "1" and at least one of the bits $C_1$, $C_2$ and $C_3$ is "0".

Further, the present inventors have found that there is some danger that a normal pattern may be discriminated as defective if the reading bit structures as shown in FIGS. 8a to 8d are applied similarly to the masks 13A and 13B when there exists a normal pattern, e.g. narrower than the minimum pattern width, as described above due to the error caused in the binary coding. As a result of various examinations and analyses for avoiding such faulty discriminations, it has been found that such a possibility may be eliminated by adopting different bit structures for the parallel-out memories 58A and 58B. This will be described in detail hereinbelow.

Figure 8A:
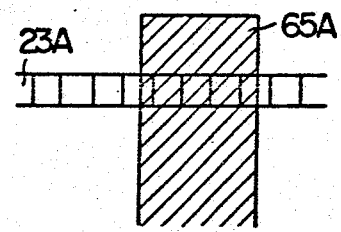
FIGS. 8a and 8b are schematic diagrams showing critical cases of coding a pattern into binary signals.
Figure 8B:
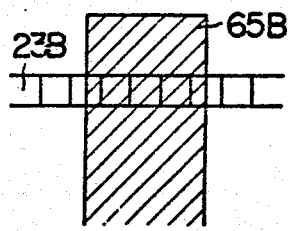
Figure 8C:
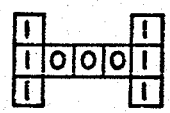
FIGS. 8c to 8e are schematic diagrams of bit structures used for parallel-out memories.
Figure 8D:
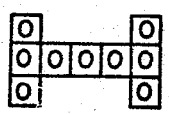
Figure 8E:
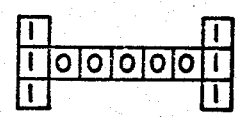

When there exists a pattern, e.g. of 4 μm, less than the minimum pattern width in each of the patterns 13A and 13B as shown in FIGS. 8a and 8b, these patterns may be coded to have widths from three bits at the minimum to five bits at the maximum by the photodiode arrays 23A and 23B. Now, provided that the pattern of FIG. 8a is binary-coded to be three bits and that of FIG. 8b to be five bits, the binary signals read out from the respective parallel-out memories 58A and 58B are as shown in FIGS. 8c and 8d, respectively. Then, the mask 13A is detected to have a minute portion but the mask 13B to have no minute portions. These detection results are compared in a defect discriminating circuit 60 and the mask 13A will be erroneously discriminated to have a defect. For avoiding such erroneous discrimination, the bit structure read out from the parallel-out memory 58B for the mask 13B may be arranged to have five bits in the central portion as shown in FIG. 8e. Namely, the binary signals read out from the parallel-out memory 58B for the mask 13B become as shown in FIG. 8e and are detected to have a minute portion. As a result, the two masks coincide to each other to have a minute portion in the defect discriminating circuit 60 and this minute portion is discriminated not to be a defect.

The present inventors have also attempted various investigations and examinations to provide highly reliable defect discrimination in the consideration of the case where the bit structure of the parallel-out memory 58A for the mask 13A has three bits in the central portion as shown in FIG. 7b and that of the parallel-out memory 58B for the mask 13B has five bits in the central portion as shown in FIG. 8e and discrimination is carried out on the data from these memories only. Namely, in such an arrangement, the discrimination criteria for detecting a minute portion or a boundary are as shown in Table I.

Table I

| Mask | Bit structure of parallel-out memory | | | | | | Criteria for detecting minute portion | |
|---|---|---|---|---|---|---|---|---|
| 13A | $A_1$ | | | | | $A_4$ | $A_1$ to $A_6$: | all "0" (or "1"), and |
|  | $A_2$ | $C_1$ | $C_2$ | $C_3$ | | $A_5$ | $C_1$ to $C_3$: | at least one "1" (or "0") |
|  | $A_3$ | | | | | $A_6$ | | |
| 13B | $B_1$ | | | | | $B_4$ | $B_1$ to $B_6$: | all "0" (or "1"), and |
|  | $B_2$ | $C_1$ | $C_2$ | $C_3$ | $C_4$ $C_5$ | $B_5$ | $C_1$ to $C_5$: | at least one "1" (or "0") |
|  | $B_3$ | | | | | $B_6$ | | |

The discrimination criteria in the defect discriminating circuit 60 in this case will become as shown in Table II.

Table II

| Case | Discrimination Criteria | | Discrimination |
|---|---|---|---|
|  | Detection result for mask 13A | Detection result for mask 13B | |
| I | 0 | 0 | 0 |
| II | 0 | 1 | 0 |
| III | 1 | 0 | 1 |
| IV | 1 | 1 | 0 |

0: absence of minute portion.
1: existence of minute portion

Figure 9A:
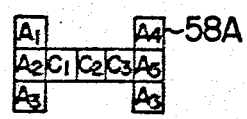
FIGS. 9a, 9b, 10a and 10b are schematic diagrams of bit structures used for the parallel-out memories.
Figure 9B:
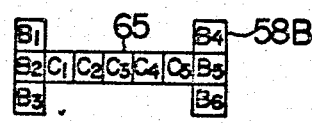
Figure 10A:
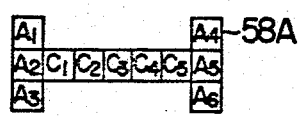
Figure 10B:
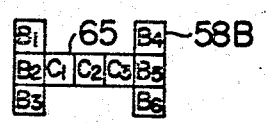

Thus, for example, when there exist no defective minute portions in the mask 13A but a defective minute portion 65 in the mask 13B as shown in FIGS. 9a and 9b, the binary signals from the parallel-out memory 58A generate a detection result of absence of any minute portion and those from the parallel-out memory 58B a detection result of existence of a minute portion. For comparing these detection results in the defect discriminating circuit 60, if the criteria of Table II are adopted, the result is that there is no defective portion while there exists a defective portion in the mask 13B. Such over-looking of defective portions may be avoided by arranging the bit structures of the parallel-out memories 58A and 58B for the masks 13A and 13B as shown in FIGS. 10a and 10b. When the bit signals from such parallel-out memories are read out and subjected to defect discrimination under the criteria of Tables III and IV, the minute portion in the mask 13B can be detected as a defective portion.

Table III

| Mask | Bit structure of parallel-out memory | | | | | | Criteria for detecting minute portion | |
|---|---|---|---|---|---|---|---|---|
| 13A | $A_1$ | | | | | $A_4$ | $A_1$ to $A_6$: | all "0" (or "1"), and |
|  | $A_2$ | $C_1$ | $C_2$ | $C_3$ | $C_4$ $C_5$ | $A_5$ | $C_1$ to $C_5$: | at least one "1" (or "0") |
|  | $A_3$ | | | | | $A_6$ | | |
| 13B | $B_1$ | | | | | $B_4$ | $B_1$ to $B_6$: | all "0" (or "1"), and |
|  | $B_2$ | $C_1$ | $C_2$ | $C_3$ | | $B_5$ | $C_1$ to $C_3$: | at least one "1" (or "0") |
|  | $B_3$ | | | | | $B_6$ | | |

Table IV

| Case | Discrimination Criteria | | Discrimination |
|---|---|---|---|
|  | Detection result for mask 13A | Detection result for mask 13B | |
| I | 0 | 0 | 0 |
| II | 0 | 1 | 1 |
| III | 1 | 0 | 0 |
| IV | 1 | 1 | 0 |

0: absence of minute portion.
1: existence of minute portion

It is impossible to completely eliminate the relative positional displacements of a pair of mask patterns due to the size errors in the masks, yawing in the translation of the xy-stage during the scanning in x- and y-directions, etc. and there exist superposition errors to some extent. In this embodiment, relative displacements of the contents in the parallel-out memories 58A and 58B up to three bits (2 μm for the relative positioning error and 1 bit for the quantization error) are tolerated. Then, the existence of a minute portion is detected in all the combinations of the bit arrangements allowing the relative shifts up to three bits in the vertical direction on the drawing and up to two bits in the horizontal direction (the quantization error one bit has already been considered in the horizontal direction as shown in FIGS. 9b and 10a.

Figure 11:
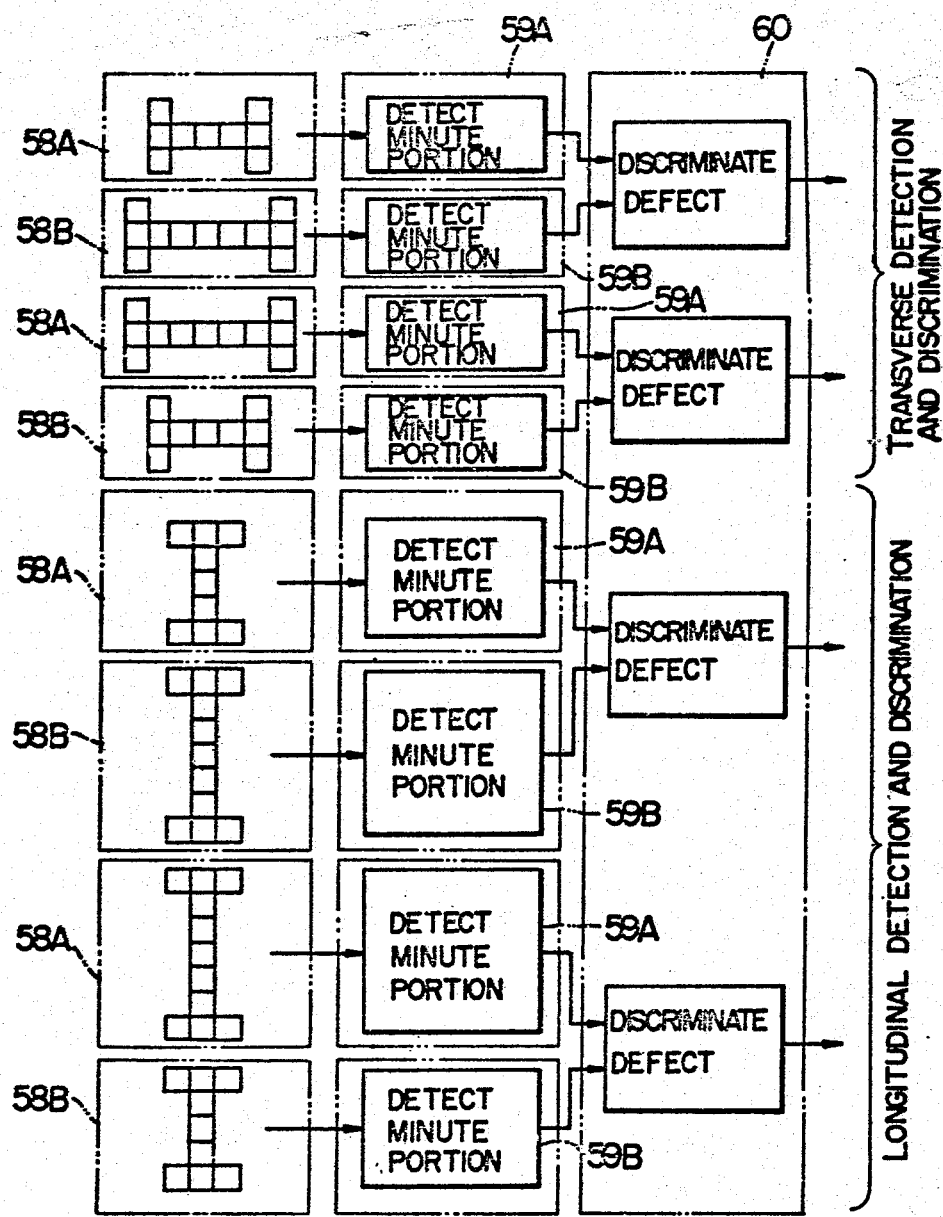
FIG. 11 is a block diagram of a defect discriminating circuit to be used in the system of FIG. 4.

Description has been made of the case where the read-out bits of the parallel-out memories 58A and 58B are aligned in the transverse direction hereinabove. In practice, they are aligned in the transverse direction and minute portions are detected as described above. The results of the detection are supplied to the defect discriminating circuit 60 to perform discrimination. FIG. 11 is a block diagram of this detection and discrimination system.

Figure 15A:
Figure 15B:
Figure 15C:
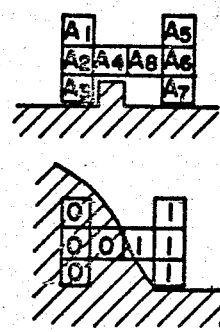

Next, description will be made of the boundary comparison method. This method becomes similar to the minute pattern comparison method after the recognition of the boundary and the description will be made on the recognition of the boundary. The boundary is defined as the group of points at which the pattern changes from black (white) to white (black). This change can be known from the change in the succeeding bits ("1" to "0" or "0" to "1") as shown in FIG. 15a. Simple detection of the change in the bit will lead to mis-discrimination of irregularities due to the quantization error as boundaries. To avoid such mis-discrimination and enable the detection of slanted boundaries, the detection bit structure is arranged as shown in FIG. 15c. The conditions for detecting a boundary in FIG. 15c are as follows:

$A_1$, $A_2$, $A_3$ and $A_4$ are all "0" and
$A_5$, $A_6$, $A_7$ and $A_8$ are all "1", or
$A_1$, $A_2$, $A_3$ and $A_4$ are all "1" and
$A_5$, $A_6$, $A_7$ and $A_8$ are all "0".

Figure 16A:
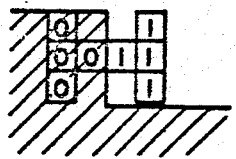
Figure 16B:
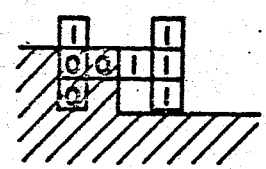
Figure 16C:
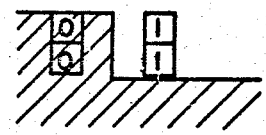

When the bit structure of FIG. 15c is adopted similarly for the masks 13A and 13B, there is a danger of mis-discriminating a normal pattern as a defective one due to the quantization error as shown in FIGS. 16a and 16b. Namely, the case of FIG. 16a generates a result that a boundary exists and that of FIG. 16b another result that there is no boundary. Such erroneous detection can be prevented by the bit structure of FIG. 16c. Further procedures are similar to those of the minute portion comparison method.

Next, the correction of defective portions will be described hereinbelow. First, a cassette tape 38 is loaded in the read-out control circuit 4 and the kind of mask having a defective portion and the position of the defective portion in the mask are read out. Then, the defective mask 13 as thus identified is mounted on a platform or stage 39 of the exposure device 3. Here, the mask surface to be corrected is preliminarily coated with a photoresist layer and dried.

The exposure device will be described briefly. The exposure device 3 comprises a carrier 40, a stage 39 disposed on this carrier 40, the movement of which is controlled by an x-scanning motor 41 and a y-scanning motor 42, and having a linear encoder 45 for discriminating the position, and an optical system mounted above this stage 39 through a column 46 extending from the carrier 40 and including an objective lens system 47, mirror cylinder 48, an eyepiece lens system 49, a slit mechanism 50 having a slit disposed in the upper part of the mirror cylinder 48, a slit driving motor 51 for adjusting the slit width, a shutter mechanism 52 having a shutter for opening a light path momentarily and a light source 53 including an ultra high pressure mercury lamp. The movements of these respective parts are automatically controlled by the read-out control device 4. Namely, the stage 39 is moved to bring a defective portion in the mask 13 precisely beneath the objective lens 47 in accordance with the information read out from the cassette tape 38. Then, the slit drive motor 51 is controlled by the information from the cassette tape 38 to determine the slit width in accordance with the size of the defective portion. Then, the shutter is actuated to sensitize the photoresist layer on the defective portion. Here, the slit width can also be adjusted manually by an operator in accordance with the size of the defective portion.

In this way, the exposure device 3 successively exposes a photoresist film on the defective portions in a mask pattern under control of the information stored in the cassette tape 38.

When the exposure for one photomask is finished, the exposed photomask is subjected to an etching treatment in the etching device 5 as shown in FIG. 2 to remove the sensitized portions of the photoresist film.

When the defective portions are excess regions outside the normal pattern, as the defective portions 35 and 37 shown in FIG. 12, the photomask is successively subjected to another etching treatment using the non-sensitized photoresist layer remaining on the photomask as an etching mask to remove such defective portions 35 and 37. In such a case, the photoresist layer is removed from the photomask thereafter to provide a mask having a normal pattern.

When the defective portions are inside the normal pattern as the defective portion 36 in FIG. 12, it means that there is no chromium film on the glass substrate where such a film should be, and hence an additional chromium layer is vacuum-deposited on the glass plate in a vacuum deposition apparatus (not shown) utilizing the photoresist layer deposited on the pattern except the defective portion 36 as a mask. Then, the photoresist layer on the mask is removed by etching to provide a normal pattern.

When there exist two kinds of defective portion in one mask, i.e. those portions to be removed and those portions to be additionally deposited, two kinds of defect correcting process should be performed successively. In practice, the defect correction of depositing a new metal layer is not suited for fine patterns and may be adequately adopted for such masks as the master reticule in which the pattern is formed ten times as large as the actual one.

According to the above embodiments, defective portions and the positions thereof in a pair of masks can be detected accurately without mis-discrimination by comparing the pair of masks. In this embodiment, defective portions having a width larger than 1 $\mu$m or a diameter larger than 2 $\mu$m can be reliably detected without failure based on the accuracies of the mask inspection unit.

Further, in this embodiment, defective portions and the positions thereof are recorded in a cassette tape and the defect correction processes are carried out using the information stored in the tape. Thus, the correction is reliable and the operation efficiency is greatly enhanced due to the automated operations.

It is to be noted that this invention is not limited to the above embodiment. For example, the information recorded in the cassette tape may be that for a single mask but not for successive masks. The recording medium may be any one such as a disk, core memory, etc. other than a magnetic tape. A random access memory may also be used to store and read out the information for correction of defective masks.

Figure 14:
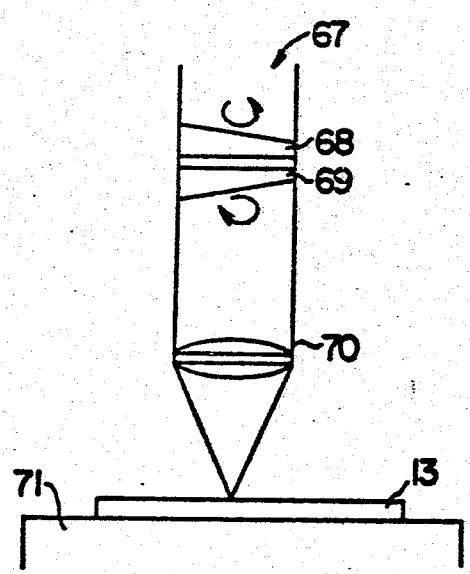
FIG. 14 is a schematic side view of a pattern correcting device using a laser beam.

In a modification embodiment, defective portions may be removed by the use of a laser beam. Namely, as shown in FIG. 14, a laser oscillator 67, e.g. an Argon laser oscillator, is used to irradiate a laser beam directly on the detected defective portions in a mask 13. The irradiation spot of the laser beam is controlled by the information stored in a cassette tape as described above. In the figure, numerals 68 and 69 denote prisms for scanning the laser beam. The laser beam can be scanned in a certain area by rotating these prisms. Numerals 70 and 71 are condenser lenses for condensing the laser beam and a stage for mounting the mask 13. The details of this technique are disclosed in the copending U.S. Ser. No. 717,375 filed Aug. 24, 1976 by Mikio Hongo et al., entitled "PROCESSING OF PHOTOMASK" based on Japanese Patent Application No. 103031/75 filed Aug. 27, 1975 and assigned to the assignee of this application.

According to the automatic mask inspection and correction method and system of this invention, minute defects in masks can be reliably detected and corrected as has been described above. Further, since the inspection and the correction of defective portions are mostly automated, the operation efficiency is greatly improved.

Further, according to this invention, since defective portions in masks are reliably detected in the detection process and identified from the information obtained in the detection in the correction processes, the detected defective portions can be reliably removed to greatly improve the yield.

What is claimed is:

1. A method of inspecting mask patterns used for forming a desired oxide pattern or a desired wiring pattern on a semiconductor wafer by disposing the mask patterns of the semiconductor wafer on the surface in close contact thereto or with a predetermined gap therefrom and wherein each mask pattern is formed of a layer of an opaque material of a predetermined pattern deposited on a surface of a transparent substrate comprising the steps of:

preparing at least two similar mask patterns;
converting the mask patterns into electric signals respectively;

converting said electric signals into binary signals on the basis of at least one reference value; and comparing said binary signals and discriminating the existence of a defect in said mask patterns by the coincidence and noncoincidence of the binary signals of said two patterns, wherein said comparing of said binary signals of said two mask patterns is carried out in a predetermined plurality of bits corresponding with the minimum pattern width of said two mask patterns respectively.

2. A method of inspecting mask patterns according to claim 1, in which said step of converting the mask patterns into electric signals is achieved by projecting lights on the respective mask patterns and electrically detecting the brightness of the mask patterns and said comparison and discrimination step includes the steps of detecting minute portions and boundaries in the mask patterns from said binary signals and comparing these results to discriminate the coincidence and noncoincidence of the binary signals for the two mask patterns.

3. A method of inspecting and correcting mask patterns used for forming a desired oxide pattern or a desired wiring pattern on a semiconductor wafer by disposing the mask patterns on the surface of the semiconductor wafer in close contact thereto or with a predetermined gap therefrom and wherein the mask patterns are each formed of a layer of an opaque material of a predetermined pattern deposited on a surface of a transparent substrate comprising the steps of:

preparing a pair of similar mask patterns;

converting the mask patterns into electric signals respectively;

converting said electric signals into binary signals on the basis of at least one reference value;

comparing said binary signals and discriminating the agreement and disagreement of said binary signals of said two mask patterns, wherein said comparing of said binary signals of said two mask patterns is carried out in a predetermined plurality of bits corresponding with the minimum pattern width of said two mask patterns respectively;

detecting a mask pattern having a portion disagreeing with the other mask pattern and the position of said disagreeing portion from said discrimination;

recording the detection results in a memory means;

reading out said mask pattern having said disagreeing portion and the coordinate of said disagreeing portion from said memory means; and correcting the disagreeing portion, wherein the correcting is carried out by selective removing of the opaque material being in an excess region outside the normal pattern and additional disposition of an opaque material on the defective portion inside the normal pattern respectively based on the detection result recorded in said memory means.

4. A method of inspecting and correcting mask patterns according to claim 3, in which said correcting step includes the steps of:

coating a photosensitive material on the whole one principal surface of a mask pattern detected to have a defect;

sensitizing the photosensitive material corresponding to the defect or the regions except the defect based on the information corresponding to said mask pattern and read out from said memory means;

removing the photosensitive material on said defect region by etching; and depositing a new opaque film on said defect region of said mask pattern using the remaining photosensitive material as a mask or removing the opaque material deposited in the defect region, thereby correcting defect portions in the mask pattern.

5. A method of inspecting and correcting mask patterns according to claim 3, in which said correcting step comprises reproducing corresponding defect portions in the mask pattern based on the information read out from the recording medium and irradiating a laser beam to defect portions to be removed to remove the defect portions.

6. A method of inspecting and correcting patterns according to claim 3, wherein said electric signals of said pair of mask patterns are converted into binary signals on the basis of a lower, a middle, and a higher threshold voltage corresponding to a dark level, a normal or average level, and a bright level of the input video signal, respectively, and further wherein the threshold-dependent binary signals respectively corresponding with the above three threshold voltages are respectively stored in a predetermined plurality of bits corresponding with the minimum pattern width of said two mask patterns, and the levels of the stored threshold-dependent bit signals are compared to determine which threshold-dependent bit signal is to be selected.

7. An apparatus for inspecting and correcting defecting portions in masks comprising:

means for mounting a pair of masks in a symmetrical positional relation and shifting said pair of masks in a plane by the same amount;

a pair of opto-electrical converter means disposed in a predetermined positional relation with said mask mounting means for converting received light into electric signals;

optical means for irradiating lights on said pair of masks and focusing the expanded images of said pair of masks on said pair of opto-electrical converter means;

a pair of binary-coding means for transforming the electric signals from said converter means into binary signals;

comparator means for comparing said binary signals for said pair of masks with each other to discriminate defective portions in said pair of masks and generate an output representing information of the defective portions;

memory means for storing and reproducing the information of detected defective portions from said comparator means; and exposure means responsive to the information of detected defective portions reproduced from said memory means for selectively exposing a photosensitive film coated on said mask.

8. The apparatus of claim 7, in which said binary-coding means includes a video signal coding circuit for converting a video signal into a binary coded signal, said coding circuit comprising a threshold voltage generator for generating different threshold voltages for signal recognition, a plurality of level comparators, each having an input to receive an input video signal and another input to receive a corresponding one of said different threshold voltages and generating a bit signal with respect to the threshold voltage, shift registers connected to store outputs of the respective level comparators and generate the stored bit signals in parallel-out form, a gate selector means including a logic circuit for processing parallel-out bit signals from the shift registers, said logic circuit comparing the threshold-dependent bit signals from the central digit positions of all the shift registers and comparing the states of successive bit signals at at least two preceding and succeeding digit positions of the shift registers with respect to the central digit position to determine which threshold-dependent bit signal be selected as a binary coded signal on the basis of predetermined logic conditions to thereby produce a selection signal for allowing the selected bit signal to be derived, and gate means responsive to said selection signal for deriving the selected bit signal as an output of the binary coding circuit from the shift register.

9. The apparatus according to claim 8, in which said threshold voltage generator generates a lower, a middle and a higher threshold voltages corresponding to a dark level, a normal or average level and a bright level of the input video signal respectively, and each of said shift registers has a five-bit length, the third bit position of which is connected to one input of said gate means.

10. A video signal processing device for processing a video signal of a mask pattern having therein minute portions into a binary coded form comprising:
means for comparing an input video signal with at least three recognition thresholds to generate threshold-dependent bit signals for each threshold on a time base;
parallel-out shift registers provided for respective thresholds for storing said threshold-dependent bit signals from said comparing means respectively, said bit signal in each shift register being shifted to its central bit position and then being outputted in parallel with bit signals at at least two preceding and succeeding bit positions with respect to the central bit position;
gate means having inputs to receive the threshold-dependent bit signals from the central bit positions of said shift registers for deriving one of said threshold-dependent bit signals as a binary coded signal in response to a selection signal; and
gate selection means including a logic circuit adapted to receive the parallel-out bit signals from all said shift registers and the threshold-dependent bit signals at their central bit positions and determine which threshold-dependent bit signal is to be selected by level comparison of the threshold-dependent bit signals, the parallel-out bit signals and combination thereof, thereby generating a selection signal to be applied to gate means.

11. An apparatus for inspecting defective portions in mask patterns used for forming a desired oxide pattern or a desired wiring pattern on a semiconductor wafer by disposing the mask patterns on the surface in close contact with the semiconductor wafer or with a predetermined gap therefrom and wherein each mask pattern is formed of a layer of an opaque material of a predetermined pattern deposited on a surface of a transparent substrate comprising:

means for mounting a pair of mask patterns in a predetermined positional relation and shifting said pair of mask patterns in a plane by the same amount;
a pair of opto-electrical converter means disposed in a predetermined positional relation with said mask pattern mounting means for converting received light into electric signals;
optical means for irradiating lights on said pair of mask patterns and focusing the expanded images of said pair of mask patterns on said pair of opto-electrical converter means;
a pair of binary-coding means for transforming the electric signals from said converter means into binary signals; and
comparator means for comparing said binary signals for said pair of mask patterns with each other in a predetermined plurality of bits corresponding with the minimum pattern width of said pair of mask patterns to discriminate defective portions in said pair of mask patterns and generating an output representing information of the defective portions.

12. An apparatus for inspecting and correcting defecting portions in mask patterns used for forming a desired oxide pattern or a desired wiring pattern on a semiconductor wafer by disposing the mask patterns on the surface of the semiconductor wafer in close contact thereto or with a predetermined gap therefrom and wherein each of the mask patterns is formed of a layer of an opaque material of a predetermined pattern deposited on a surface of a transparent substrate comprising:
means for mounting a pair of mask patterns in a symmetrical positional relation and shifting said pair of mask patterns in a plane by the same amount;
a pair of opto-electrical converter means disposed in a predetermined positional relation with said mask pattern mounting means for converting received light into electric signals;
optical means for irradiating lights on said pair of mask patterns and focusing the expanded images of said pair of mask patterns on said pair of opto-electrical converter means;
a pair of binary-coding means for transforming the electric signals from said converter means into binary signals;
comparator means for comparing said binary signals for said pair of mask patterns with each other in a predetermined plurality of bits corresponding with the minimum pattern width of said pair of mask patterns to discriminate defective portions in said pair of mask patterns and generating an output representing information of the defective portions;
memory means for storing and reproducing the information of detected defective portions from said comparator means; and
exposure means responsive to the information of detected defective portions reproduced from said memory means for selectively exposing a photosensitive film coated on said mask pattern.

* * * * *